US012695416B2

(12) United States Patent
Pan

(10) Patent No.: US 12,695,416 B2
(45) Date of Patent: Jul. 28, 2026

(54) HYBRID SOLAR POWER SYSTEM USING PHOTOVOLTAIC AND THERMAL CONCENTRATION

(71) Applicant: DWP Energy Solutions, LLC, Vancouver, WA (US)

(72) Inventor: Wei Pan, Vancouver, WA (US)

(73) Assignee: DWP Energy Solutions, LLC, Vancouver, WA (US)

( * ) Notice: Subject to any disclaimer, the term of this patent is extended or adjusted under 35 U.S.C. 154(b) by 0 days.

(21) Appl. No.: 19/269,788

(22) Filed: Jul. 15, 2025

(65) Prior Publication Data

US 2026/0031760 A1     Jan. 29, 2026

Related U.S. Application Data

(60) Provisional application No. 63/675,983, filed on Jul. 26, 2024.

(51) Int. Cl.
H02S 40/44 (2014.01)
H02S 40/22 (2014.01)
H10F 77/42 (2025.01)

(52) U.S. Cl.
CPC .............. H02S 40/44 (2014.12); H02S 40/22 (2014.12); H10F 77/484 (2025.01); H10F 77/488 (2025.01); H10F 77/492 (2025.01)

(58) Field of Classification Search
None
See application file for complete search history.

(56) References Cited

U.S. PATENT DOCUMENTS

| | | | | | |
|---|---|---|---|---|---|
| 4,355,630 | A | * | 10/1982 | Fattor | F24S 30/425 136/246 |
| 2013/0167903 | A1 | * | 7/2013 | Aspnes | G02B 5/32 136/246 |
| 2016/0099367 | A1 | * | 4/2016 | Wheelwright | H02S 40/22 136/248 |
| 2020/0359571 | A1 | * | 11/2020 | Pan | H02S 30/10 |

FOREIGN PATENT DOCUMENTS

WO     WO-2012005415 A1 *  1/2012  ........... H10F 77/484

OTHER PUBLICATIONS

English-language machine translation of WO-2012005415-A1. (Year: 2026).*

* cited by examiner

*Primary Examiner* — Eli S Mekhlin
(74) *Attorney, Agent, or Firm* — Law Office of Gerald Maliszewski; Gerald Maliszewski

(57) ABSTRACT

Hybrid photovoltaic (PV) and thermal energy collection systems and methods are provided. One system includes bi-facial PV cells arranged in a first plane, with each PV cell having a first face to directly accept incident light and a second face to accept reflected light. Dichroic splitters underlie transparent spaces in the first plane and reflect R band wavelengths of light to the second face of corresponding PV cells, while transmitting T band wavelengths of light. Optical units underlie the dichroic splitters, accepting T band (e.g., visible) light from corresponding dichroic splitters, and transmitting focused T band light to a thermal collection tube. In another variation, PV cells are arranged in a first plane with optical units. The optical units focus T band wavelengths of light, which are concentrated by a light funnel and provided to a thermal collection tube.

20 Claims, 10 Drawing Sheets

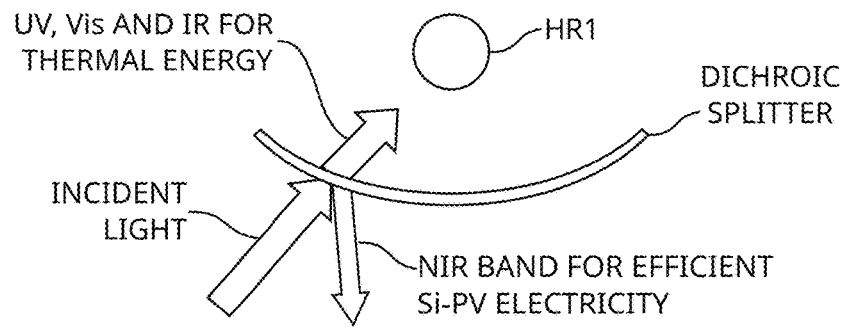
UV, Vis AND IR FOR THERMAL ENERGY
HR1
DICHROIC SPLITTER
INCIDENT LIGHT
NIR BAND FOR EFFICIENT Si-PV ELECTRICITY
Fig. 1 (PRIOR ART)
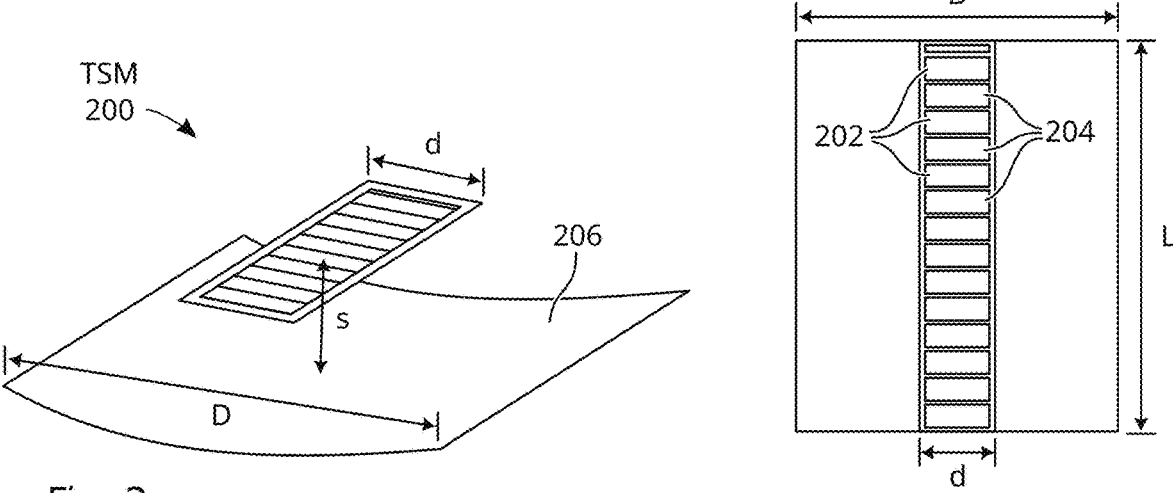
TSM 200
d
s
206
D
D
202
204
L
d
Fig. 2
300
INCIDENT LIGHT
310
| OPTICAL UNITS | PV CELLS |
|---|---|
| 312 | 302 |
FOCUSED LIGHT
LIGHT FUNNEL
324
THERMAL COLLECTION TUBE
322
THERMAL ENERGY       ELECTRICAL ENERGY
Fig. 3A

| 302 | 302 | 302 | 302 | 302 |
|-----|-----|-----|-----|-----|
| 312 | 312 | 312 | 312 | 312 |

| 302 | 302 | 302 | 302 | 302 |
|-----|-----|-----|-----|-----|
| 312 | 312 | 312 | 312 | 312 |
| 302 | 302 | 302 | 302 | 302 |

| 312 | 312 | 312 | 312 | 312 |
|-----|-----|-----|-----|-----|
| 302 | 302 | 302 | 302 | 302 |
| 312 | 312 | 312 | 312 | 312 |

800

START — 1400

PV CELLS ACCEPTING INCIDENT LIGHT — 1402

CONVERTING TO ELECTRICAL ENERGY — 1404

OPTICAL UNITS ACCEPTING INCIDENT LIGHT — 1406

FOCUSING T BAND WAVELENGTHS — 1408

TRANSMITTING FOCUSED T BAND WAVELENGTHS — 1410

LIGHT FUNNEL ACCEPTING FOCUSED LIGHT — 1412

LIGHT FUNNEL TRANSMITTING CONCENTRATED LIGHT — 1414

THERMAL COLLECTION TUBE CONVERTING CONCENTRATED LIGHT TO THERMAL ENERGY — 1416

HYBRID SOLAR POWER SYSTEM USING PHOTOVOLTAIC AND THERMAL CONCENTRATION

BACKGROUND OF THE INVENTION

Field of the Invention

This invention generally relates to solar generated power and, more particularly to a hybrid system that combines thermal and photovoltaic for electric and thermal energy generation and storage.

Description of the Related Art

Greenhouses require electricity and heat to operate optimally. During the daytime a greenhouse can obtain heat from the sunlight. The interior temperature varies with the time, with the temperature attaining a high in daytime and a low in the night. Thus, a Heating, Ventilation, and Air Conditioner (HVAC) system is often necessary to regulate the interior greenhouse temperatures for crop growth. Conventionally, any excessive heat from sunlight cannot be stored for nighttime use. Although prior art technology enables a greenhouse roof to harvest some sunlight to generate electricity, which can be sold or stored in a battery for later use, until recently heat has not typically been collected on the greenhouse roof and stored.

Many agricultural processes require low temperature processing heat, such as the pasteurizing process. This process requires a heat stream at 70° C. to kill bacteria carried in all natural agricultural products. Furthermore, low temperature heat is also used in the field of water desalination. For example, the air-gap membrane distillation process utilizes low temperature heat stream to drive the water desalination processes. The maximum temperature is around 80° C. The heat level at the temperature range between 50° C. to 90° C. is usually characterized as "waste heat".

Therefore, managing any dispatchable solar-generated "waste heat" through collection and conversion to a storable medium would be beneficial for many agricultural and industrial processes. Thus, it would be highly desirable for a hybrid solar module to be able to generate both electricity and heat with dispatchability when needed. For example, the dispatchable "waste heat" can keep a greenhouse warm at night, while as the dispatchable electricity can power the communities surrounding the greenhouses.

It is obvious that permitting solar irradiation into an enclosure raises its interior temperature. Taking a greenhouse as an example, the interior temperature varies with diurnal cycle. During the day the interior temperature rises to a point where an HVAC system may be necessary to abate the excessive heat caused by solar irradiation. The temperature drops during the night and if it reduces too significantly, a heating system may be necessary to maintain a proper temperature. In other words, the temperature cycle is not controlled in cost efficient manner.

FIG. 1 is a partial cross-sectional view depicting reflected and transmitted wavelength bands of a spectrum beam splitter (prior art). Such a device may be made using glass prisms, half-silvered mirrors, or a dichroic optical coating. Depending on characteristics such as thin-film interference, the ratio of reflection to transmission varies as a function of the wavelength of the incident light. Alternatively, a dichroic mirrored prism assembly uses dichroic optical coatings to divide an incoming light beam into a number of spectrally distinct output beams. As shown in this example, such a design permits ultraviolet (UV), visible (Vis), and infrared (IR) light to be collected as thermal energy at a heat receiver HR1, and near infrared (NIR) to be collected as photovoltaic energy by photovoltaic cells (not shown).

FIG. 2 depicts an embodiment from U.S. Pat. Nos. 11,700,798 and 11,631,778, both of which are incorporated by reference, showing a Translucent Solar Module (TSM) (prior art). The TSM comprises a surface that is largely empty (transparent) area and a smaller area occupied by the bi-facial PV panels to accept incident light. If the dichroic splitter is designed to pass visible light, then a large portion of visible light passes through it, into an underlying garden for example, while NIR wavelength light is reflected by a dichroic reflector and concentrated to the back of the PV panel to boost electricity production. The PV panel is bi-facial able to receive photons from both sides, directly incident and reflected, resulting in enhanced PV power as compared to the same panels without the dichroic reflector. Since the NIR wavelength light is reflected back to the PV panel, less heat enters the underlying (e.g., garden) area, reducing HVAC energy usage. Enhanced PV cell energy generation with HVAC energy savings can reduce greenhouse farming costs. However, practical experience has taught that harvesting more electricity is beneficial to growers in southern states, while harvesting heat may benefit growers in northern states. Therefore, this system may not be practical for all environments.

It would be advantageous if solar irradiation could be completely collected (converted) into electricity and heat to be used as needed. Since the solar spectrum is fully collected in the forms of electricity and heat, it can be stored and dispatched as needed.

It would be advantageous if the above-mentioned system could maintain energy conversion efficiency with shifting diurnal cycles.

SUMMARY OF THE INVENTION

Hybrid solar generators employing a dichroic spectrum splitter, and the problems associated with these designs have been explored extensively, as described in one example above in the Background Section. The system described herein improves upon conventional methods by adding a means of collecting solar generated heat for storage and ultimately for dispatch when required.

In one aspect a dichroic splitter can be used to split the solar spectrum into two bands. T band wavelength light is allowed to pass and be absorbed by a thermal receiver. The R band wavelength light is reflected back to the photovoltaic (PV) cells. In one aspect the R band wavelengths are in the ultraviolet (UV) and infrared (IR) bands, and in another aspect the R band is near-infrared (NIR), and the T band wavelength is in the visible wavelength bands (e.g., 400 to 700 nanometers (nm)).

In a different aspect, a hybrid photovoltaic (PV) system converts solar power into both electricity and thermal energy by parallel processing two different wavelength bands of the solar spectrum. The NIR spectra are used for direct electricity production through silicon (Si) PV devices, taking advantage of maximum PV efficiency in this wavelength band. The ultraviolet (UV), visible, and infrared (IR) spectra are used for thermal energy collection, where the heat is conveyed to a central power block via a heat transfer fluid. Thus, the hybrid system can deliver higher energy (combined electrical and thermal energy) than either a PV or concentrated solar power (CSP) system alone. That is, the hybrid system not only generates variable electricity but also produces dispatchable thermal energy for low cost and high capacity thermal storage. An added thermal storage capacity, besides electricity generation, provides a well-balanced power generation system. Dispatchability addresses grid needs by delivering power when the demand is high. Thus, a grid tied hybrid system can sell electricity to maximize revenues or electrically store energy for future use.

For example, considering two light bands, visible (400-700 nm) and NIR (700-1100 nm), a silicon (Si) PV does not absorb wavelengths longer than 1100 nm. The photons in these bands have different photon energies, depending on their wavelength, but there are almost the same number of photons in the visible and NIR bands. Thus, the NIR band generates a similar photocurrent in PV cells as the visible band, but with much less energy loss as compared to using visible band for PV. Since the visible band has a higher photon energy, it is advantageous to use this band for heat, as compared to using NIR for heat.

Accordingly, a hybrid photovoltaic and thermal energy collection system is provided. The system includes a plurality of bi-facial PV cells arranged in a first plane, with each PV cell having a first face to directly accept incident light and a second face to accept reflected light. A plurality of arcuate dichroic splitters underlies the first plane at a distance. Each dichroic splitter has a first face to reflect R band wavelengths of light to the second face of corresponding PV cells, and a second face transmitting T band wavelengths of light. For example, the T band may be visible wavelengths and the R band may be NIR wavelengths. In one aspect the bi-facial PV cells are arranged in a grid pattern in a first plane, with spacings between the bi-facial PV cells, with the dichroic splitters formed underlying the spacings in the first plane.

A plurality of optical units underlies the dichroic splitters, with each optical unit having a first face to accept T band light from corresponding dichroic splitters, and a second face to transmit focused T band light to a thermal region underlying the optical units. The optical units may, for example, be linear Fresnel lenses, cylindrical lenses, or acylindrical lenses. A thermal collection tube is formed in the thermal region to accept focused T band light, which is then converted to thermal energy.

The entire system, or sub-components of the system, may be rotatable, either manually or automatically, to optimally receive solar energy, in response to the time of day, season, or latitude. In one example, the dichroic splitters are aligned independent of the PV cells in the first plane. So that while the first faces of the PV cells in the first plane may be aligned to optimally accept incident light at a first time of day (or season), the dichroic splitters may be aligned to optimally reflect light at a second time of day (or season). Changes in dichroic splitter alignment may be aided through mounting on a configuration (e.g., rotatable) mechanism. Further, this configuration mechanism may in some aspects completely remove the dichroic splitters, the optical units, the thermal collection tube, or all these sub-components from the light path, permitting the supply of both T band and R band wavelengths to underlying structures, such as a greenhouse.

In a second aspect, the hybrid photovoltaic and thermal energy collection system includes a plurality of PV cells arranged in a grid in a first plane; in one aspect, with spacings between adjacent PV cells. As above, each PV cell has a (first) face to accept incident light. A plurality of optical units is arranged in the first plane, with each optical unit having a first face to accept incident light and a second face transmitting focused light to a thermal region underlying the first plane. For example, the optical units may be arranged in the PV cell spacings. A thermal collection tube is formed in the thermal region to accept focused light. Typically a light funnel is formed to accept focused light from the optical units and supply concentrated light to the thermal collection tube. In one variation each light funnel is a dielectric material optimally configured to transmit a full spectrum of light, or alternatively, a particular range of light wavelengths accepted at an optical input aperture, initially by refraction, and subsequently to the thermal collection tube via total internal reflection (TIR).

Additional details of the above-described systems and associated methods are presented below.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention. In the drawings:

FIG. 1 is a partial cross-sectional view depicting reflected and transmitted wavelength bands of a spectrum beam splitter (prior art).

FIG. 2 depicts an embodiment from U.S. Pat. Nos. 11,700,798 and 11,631,778, both of which are incorporated by reference, showing a Translucent Solar Module (TSM) (prior art).

FIGS. 3A and 3B are, respectively, schematic and partial cross-sectional views of a hybrid photovoltaic and thermal energy collection system.

DETAILED DESCRIPTION

Figure 3B:
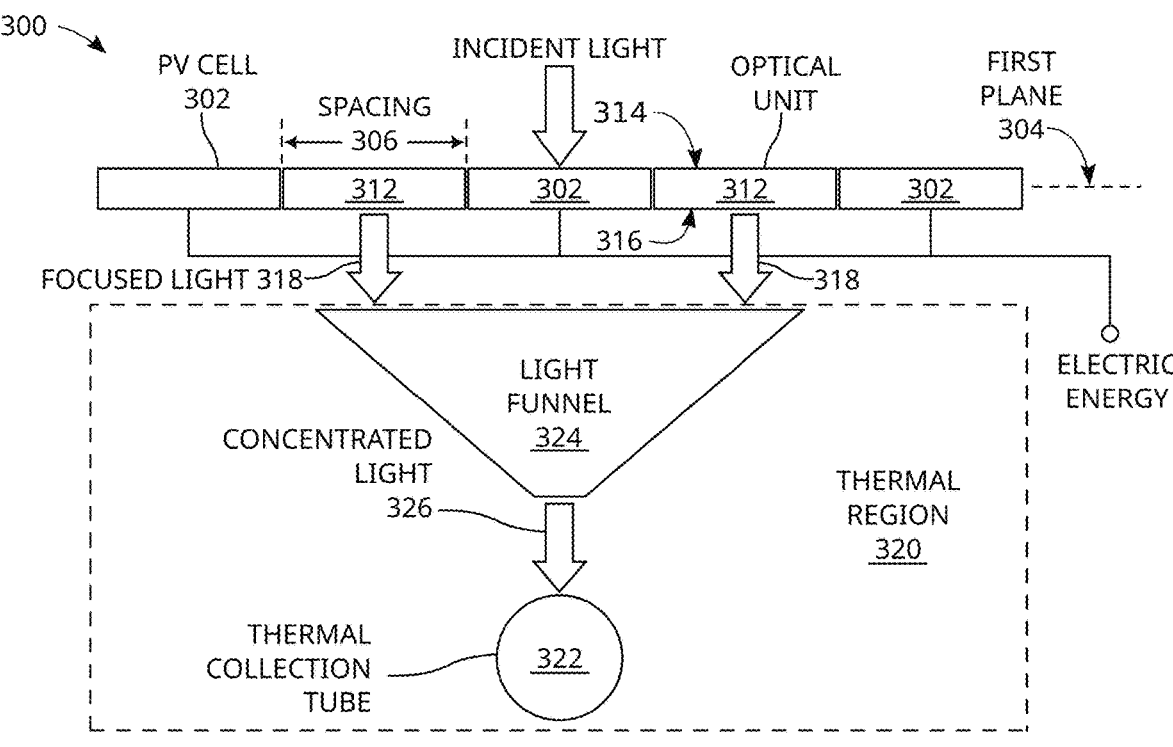

In the drawings, like numerals indicate like elements throughout. Certain terminology is used herein for convenience only and is not to be taken as a limitation on the present invention. The terminology includes the words specifically mentioned, derivatives thereof, and words of similar import. The embodiments illustrated below are not intended to be exhaustive or to limit the invention to the precise form disclosed. These embodiments are chosen and described to best explain the principle of the invention and its application and practical use and to enable others skilled in the art to best utilize the invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims are recited in a particular sequence with corresponding labeling, unless the claim recitations otherwise imply a particular sequence for implementing some or all of those elements, those elements are not necessarily intended to be limited to being implemented in that particular sequence.

U.S. Pat. Nos. 11,631,778 and 11,700,798, both invented by the current inventor, are incorporated herein as though fully set forth. Referring again to FIG. 2, the translucent solar module (TSM) system 200 includes a set of bi-facial silicon photovoltaic (PV) panels 202 that are arranged in such a way that there are spacings 204 between panels 202 to allow light to pass through, and a set of dichroic reflectors (splitters) 206 are placed under those PV panels 202 with a distance from the panels 202. The dichroic reflectors 206 pass visible light but reflect near infrared (NIR) light. Thus, the visible light passes through reflector 206 to cultivate agriculture products, for exemplar, whereas NIR light is collected by panels 202 for electricity generation. By doing so, system 200 can produce as much as 50% more electricity as compared to PV modules without NIR light collection. However, as noted above, the temperature cycle is not necessarily controlled in cost efficient manner.

FIGS. 3A and 3B are, respectively, schematic and partial cross-sectional views of a hybrid photovoltaic and thermal energy collection system. The system 300 comprises a plurality of PV cells 302 arranged in a grid in a first plane 304. Each PV cell 302 has a face 308 to accept incident light 310. A plurality of optical units 312 are arranged in the first plane 304. In one aspect, as shown, the optical units 312 are formed in spacings 306 between PV cells 302. Alternatively, there are no spacings between the PV cells and the optical units are arranged alongside the PV cells (e.g., see FIG. 5C). Each optical unit 312 has a first face 314 to accept incident light 310 and a second face 316 transmitting focused light 318 to a thermal region 320 underlying the first plane 304. Although only one row of combined PV cells 302 and optical units 312 is shown, it should be understood that the system may be enabled with multiple parallel rows. A thermal collection tube 322 underlies the optical units 312. Optionally, as shown, one or more light funnels 324 are present to accept focused light 318 from the optical units 312 and supply concentrated light 326 to the thermal collection tube 322, also referred to herein as a heat collection element (HCE). Typically, each light funnel 324 is a dielectric material optimally transmitting a full spectra of T band light, or alternatively, one particular range of light wavelengths, which are accepted at an optical input aperture, initially by refraction, and subsequently to the thermal collection tube via total internal reflection (TIR).

For example, the light funnel 324 may be a compound parabolic concentrator. If not full spectrum of light, the T band may be visible wavelengths of light. The optical units 312 may be linear Fresnel lenses, cylindrical lenses, or acylindrical lenses. A linear Fresnel lens, for example, may be a glass or plastic plate on which grooves are engraved to bend incoming light, causing the light to focus on a linear line. The Fresnel lens can be inexpensively hot embossed in a plastic plate, such as poly(methyl methacrylate) (PMMA). However, Fresnel lenses have losses from scattered light and are difficult to coat. Acylindrical lenses have less scattering, but require more material. Glass acylindrical lenses can be anti-reflective (AR) coated to reduce loss.

Figure 12:
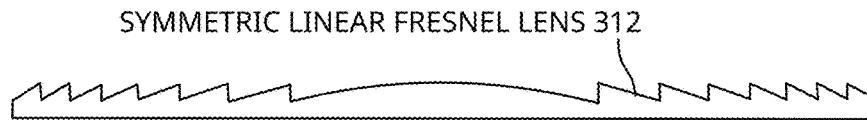
FIG. 12 is a partial cross-sectional view depicting an exemplary Fresnel lens.

A linear Fresnel lens has a smaller form factor as compared to conventional concentrating optical lenses. The lenses may be angled relative to each other to direct refracted light to a minimal area, such as to the thermal collection tube 322. An illustration of a linear Fresnel lens is shown in FIG. 12. In one aspect the optical units 312 and light funnel 324 may be configured to optimally focus and transmit T band light in the visible wavelength range. In one aspect, the R band wavelengths are in the range between 700 and 1100 nanometers (nm). However, the system is not limited to any particular R or T band wavelength definitions.

Figure 4A:
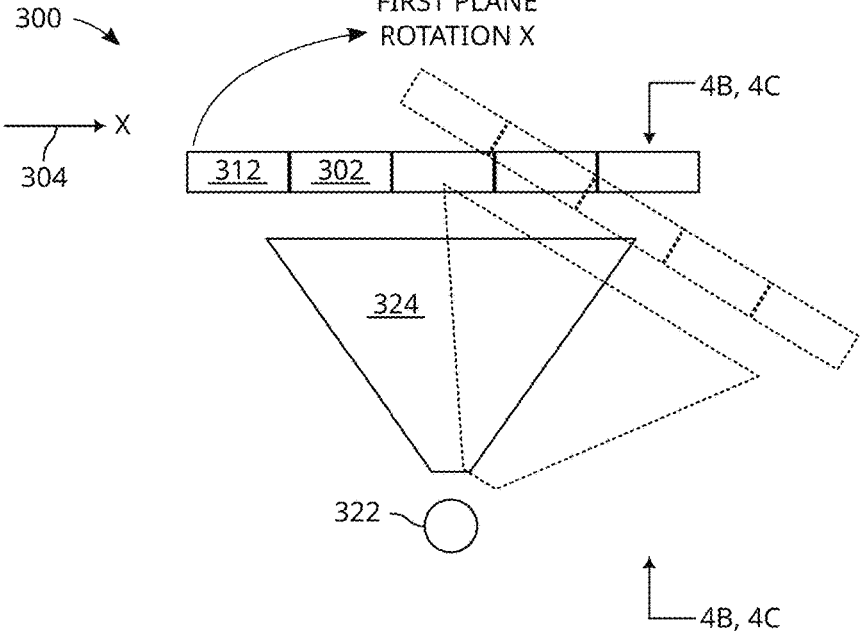
FIGS. 4A through 4C are partial cross-sectional views depicting the system of FIGS. 3A and 3B featuring alignment options.
Figures 4B, 4C, 5A, 5B, 5C:
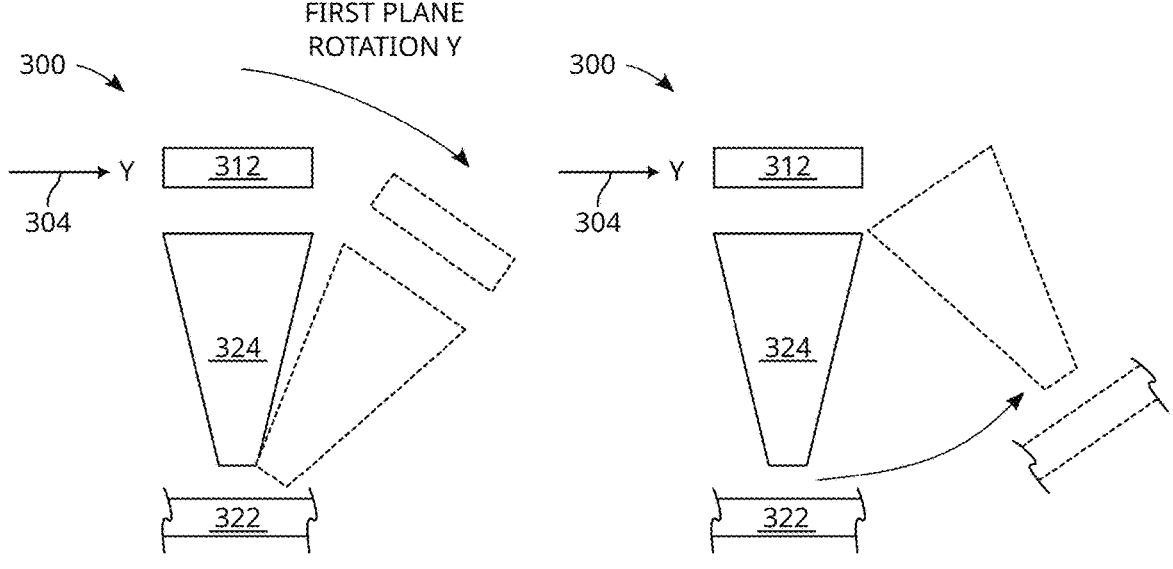
FIGS. 5A through 5C are plan views depicting the system of FIGS. 3A and 3B featuring some exemplary variations in the ratio of PV cells to optical units using multiple rows.

FIGS. 4A through 4C are partial cross-sectional views depicting the system of FIGS. 3A and 3B featuring alignment options. In some aspects the elements (components) of the system are rotatable in one or two dimensions with respect to the initial first plane 304, in the X plane (FIG. 4A) and/or in the Y plane (FIG. 4B). The rotations can be aided by mounting the PV cells 302, optical units 312, optical funnel 324, and/or thermal collection tube to configuration mechanisms such as a shaft, spindle, or rollers (not shown) operated either manually or automatically by a motor and controller to track movement in the position of the Sun. Sun-tracking software is well known in the art. FIG. 4C depicts the configuration mechanism removing the light funnel and thermal collection tube from the light path, such as might be desirable in a greenhouse during some portions of the day or season.

FIGS. 5A through 5C are plan views depicting the system of FIGS. 3A and 3B featuring some exemplary variations in the ratio of PV cells 302 to optical units 312 using multiple rows. Not shown in these examples are variations where the rows include optical units formed in the spacings between PV cells, as seen in FIG. 3B, but such a variation is also contemplated. In one aspect the ratio of PV cell 302 face surface area (the face collecting incident light) to optical unit first face 314 surface area is in the range of 1:2 to 1:6.

Figure 6:
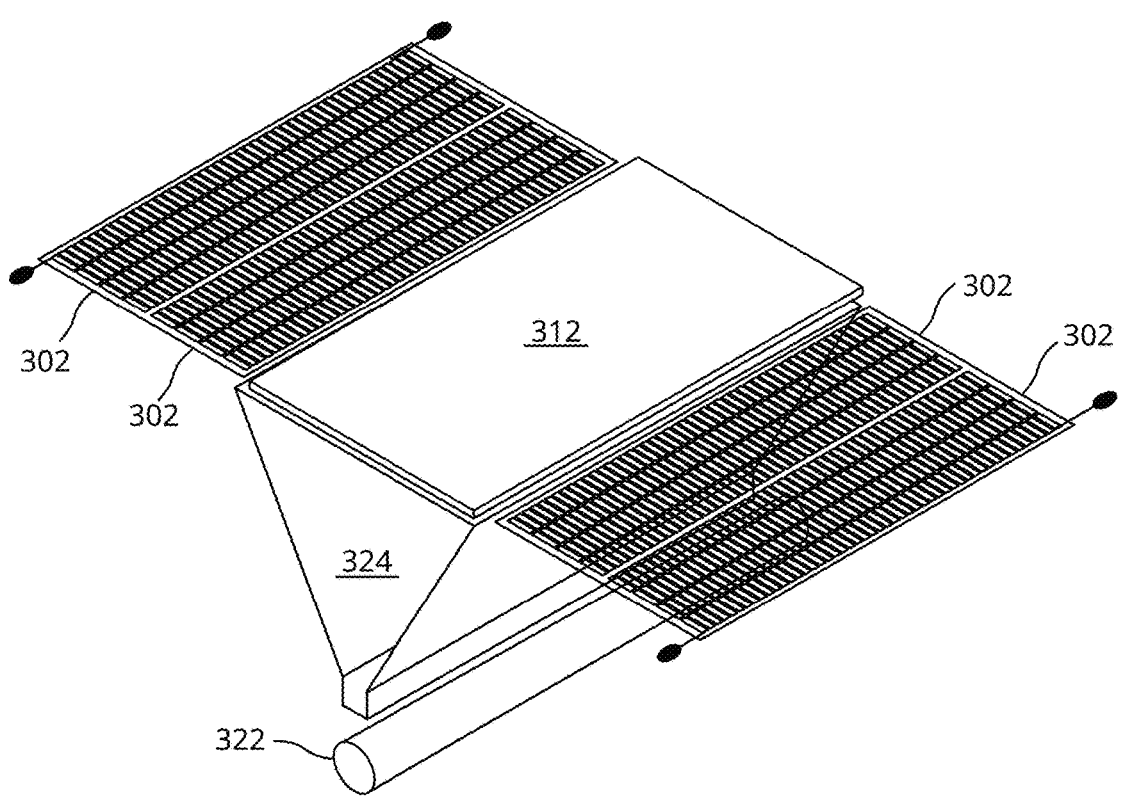
FIG. 6 is a perspective view of the system of FIGS. 3A and 3B showing 4 rows of PV cells and a center row of optical unit.

FIG. 6 is a perspective view of the system of FIGS. 3A and 3B showing 4 rows of PV cells 302 and a center row of optical unit 312.

Figure 7:
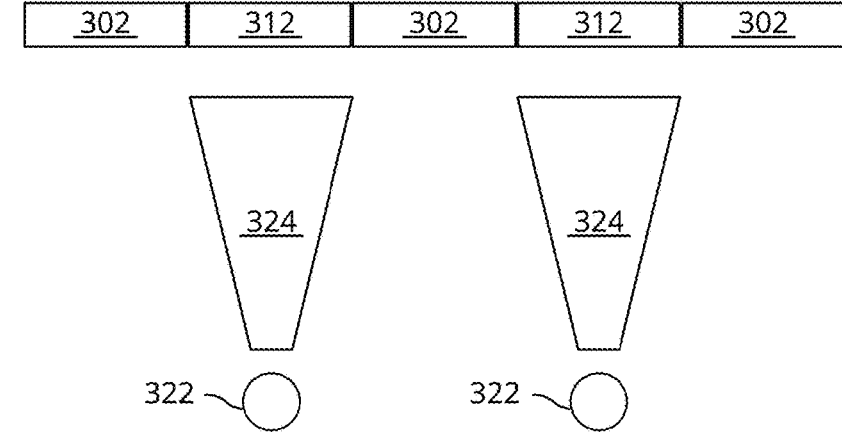
FIG. 7 is a partial cross-sectional view depicting the system of FIGS. 3A and 3B with a plurality of thermal collection tubes and corresponding optical funnels.

FIG. 7 is a partial cross-sectional view depicting the system of FIGS. 3A and 3B with a plurality of thermal collection tubes and corresponding optical funnels. In this example two thermal collection tubes are shown but the system is not limited to any particular number.

FIGS. 8A through 8D are respectively, schematic (FIG. 8A), orthogonal partial cross-sectional (FIGS. 8B and 8C), and perspective (FIG. 8D) views of another type of hybrid photovoltaic and thermal energy collection system. The system 800 comprises a plurality of bi-facial PV cells 802 arranged in a first plane 804. Each PV cell 802 has a first face 806 to directly accept incident light 808 and a second face 810 to accept reflected light. A plurality of arcuate dichroic splitters 812 with hyperbolically curved surfaces underlies the first plane 804 at a first distance 828. Each dichroic splitter 812 has a first face 814 to reflect R band wavelengths of light to the second face 810 of corresponding PV cells, and a second face 816 transmitting T band wavelengths of light. A plurality of optical units 818 underlie the dichroic splitters 812, with each optical unit having a first face 820 to accept T band light wavelengths from corresponding dichroic splitters, and a second face 822 to transmit focused T band light. The thermal collection tube 824 is aligned along the primary linear focus of the optical units 818 and the optical units are aligned along the primary linear focus of the dichroic spectrum splitters 814. A thermal collection tube 824 accepts focused T band light wavelengths. In one aspect the T band wavelengths of light are in the visible range and the optical units 818 are configured to optimally focus T band wavelengths. As above, the optical units are typically linear Fresnel lenses, cylindrical lenses, or acylindrical lenses.

As shown in these examples, the bi-facial PV cells 802 are arranged in a grid pattern in a first plane, with spacings 826 between the bi-facial PV cells, and the dichroic splitters 812 are formed underlying the spacings in first plane. Although not explicitly shown in this figure, the system may include multiple rows of PV cells with spacings.

In general support of the above-described systems it is noted that the band gap of Si is 1.1 eV. Thus, photons with an energy higher than 1.1 eV are absorbed to generate photocurrent. The wavelength range of the visible band varies from 400 nm to 700 nm, corresponding to photon energies of 3.1 eV to 1.77 eV. The NIR band ranges from 700 nm to 1100 nm, corresponding to photon energies of 1.77 eV to 1.1 eV. If a Si material absorbs visible light, there is an excessive photon energy that is above the Si band gap (1.1 eV) and this energy is lost. For example, a 3.1 eV photon loses 2 eV before generating a photocurrent in Si material. On the other hand, a photon with an energy close to Si band gap loses less energy before generating the same photocurrent. Therefore, it is preferable to use the NIR band for PV electricity generation and visible wavelengths for heat generation, assuming a similar number of photons in the two bands. In this way all the photon energy in these bands is harvested, according to their wavelength. This is the essence of solar spectrum splitting to optimize its utilization efficiency.

In the application where the visible light band can be used for agriculture activities, the maximum utilization efficiency of solar spectrum need not always be emphasized. This is because the visible band has a specific use for crop growth, as the chlorophyll in the leaves absorbs the visible band. However, in the case where both heat and electricity are needed from the solar spectrum, utilization efficiency is based upon visible wavelengths for heat and NIR for PV electricity. Thus, the systems described herein take advantage of the fact that a linear Fresnel lens has a much higher optical efficiency when concentrating visible wavelengths, as compared to concentrating the full spectrum, while maximally collecting NIR wavelength energy by wavelength splitting. Further, if Fresnel lenses are used for additionally concentrating wavelengths outside the visible band, optical funnels can be used to enhance optical efficiency.

Conventionally, solar energy collection systems have been built around two, sometimes contrary principles regarding visible light. Both principles assume that light energy can be more efficiently collected and converted into useful forms of energy, depending on specific applications, by separating light by wavelength. One assumption is that the energy of visible light should be collected as photovoltaic energy and converted to electricity, and other wavelengths of light treated as waste energy or (optionally) collected as a form of heat energy. A second assumption, especially associated with greenhouses, is that non-visible wavelengths of light should be collected as photovoltaic energy and visible light treated as potential "waste" energy, such as might be used to heat a greenhouse in the right conditions (see the description of FIG. 2, above). Neither of these conventional principles treat visible light energy as a source of energy that can be most efficiently (non-wastefully) collected using an independent heat collection subsystem. The systems described by FIGS. 3A-3B and FIGS. 8A-8D take the non-intuitive approach of treating visible wavelengths of light that might otherwise be a potential waste energy or inefficient PV energy, and efficiently converting these wavelengths into dispatchable heat energy.

Figure 8A:
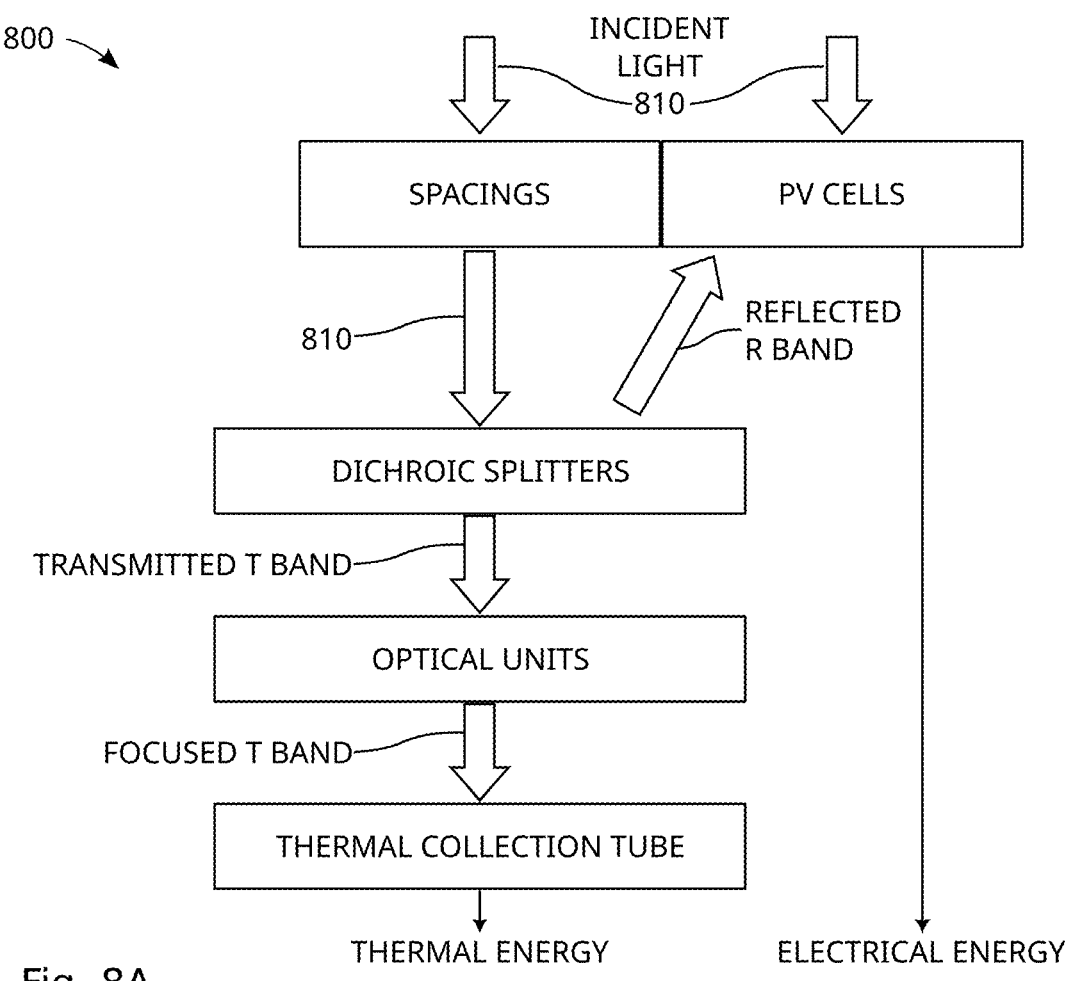
FIGS. 8A through 8D are respectively, schematic, partial cross-sectional, and perspective views of another type of hybrid photovoltaic and thermal energy collection system.
Figure 8B:
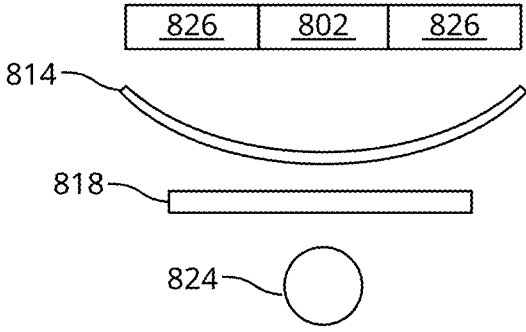
Figures 8C, 8D, 9A, 9B:
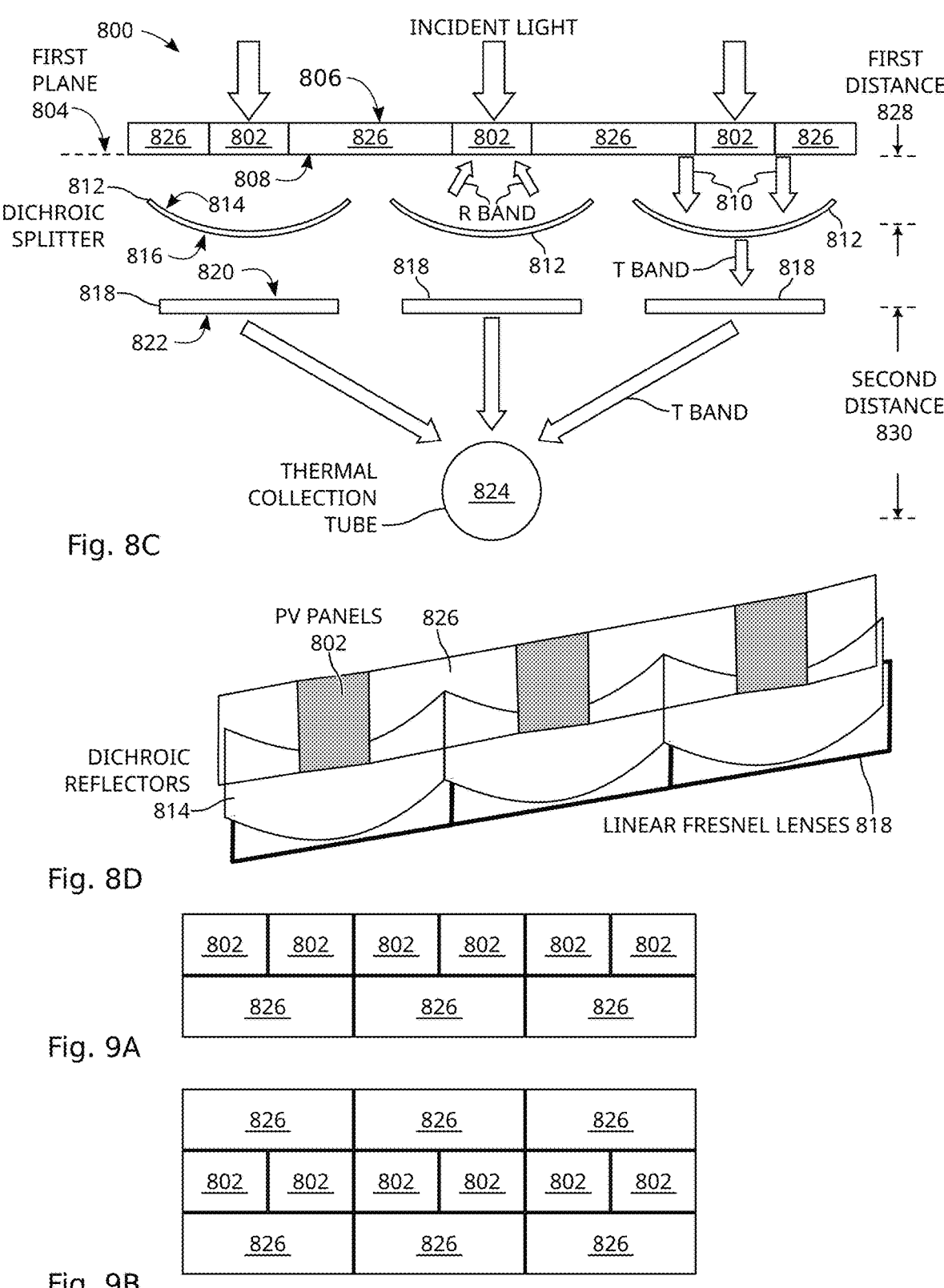
FIGS. 9A through 9B depict the system of FIGS. 8A through 8D featuring some exemplary variations in the ratio of PV cells to spacings using multiple rows.

FIGS. 9A through 9B depict the system of FIGS. 8A through 8D featuring some exemplary variations in the ratio of PV cells 802 to spacings 826 using multiple rows. The dichroic splitters 814 underlying the spacings are not shown. Also not shown in these examples are variations where the rows include spacings between PV cells, as seen in FIG. 8B, but such a variation is contemplated. In this manner the ratio of PV cell first face surface area of dichroic splitter first face surface area can be varied. In one aspect the ratio of PV cell first face surface area to dichroic first face surface area is in the range of 1:2 to 1:6. Note, FIG. 8AB may be seen as a partial cross-sectional view of FIG. 9B.

Figures 10A, 10B, 10C, 10D:
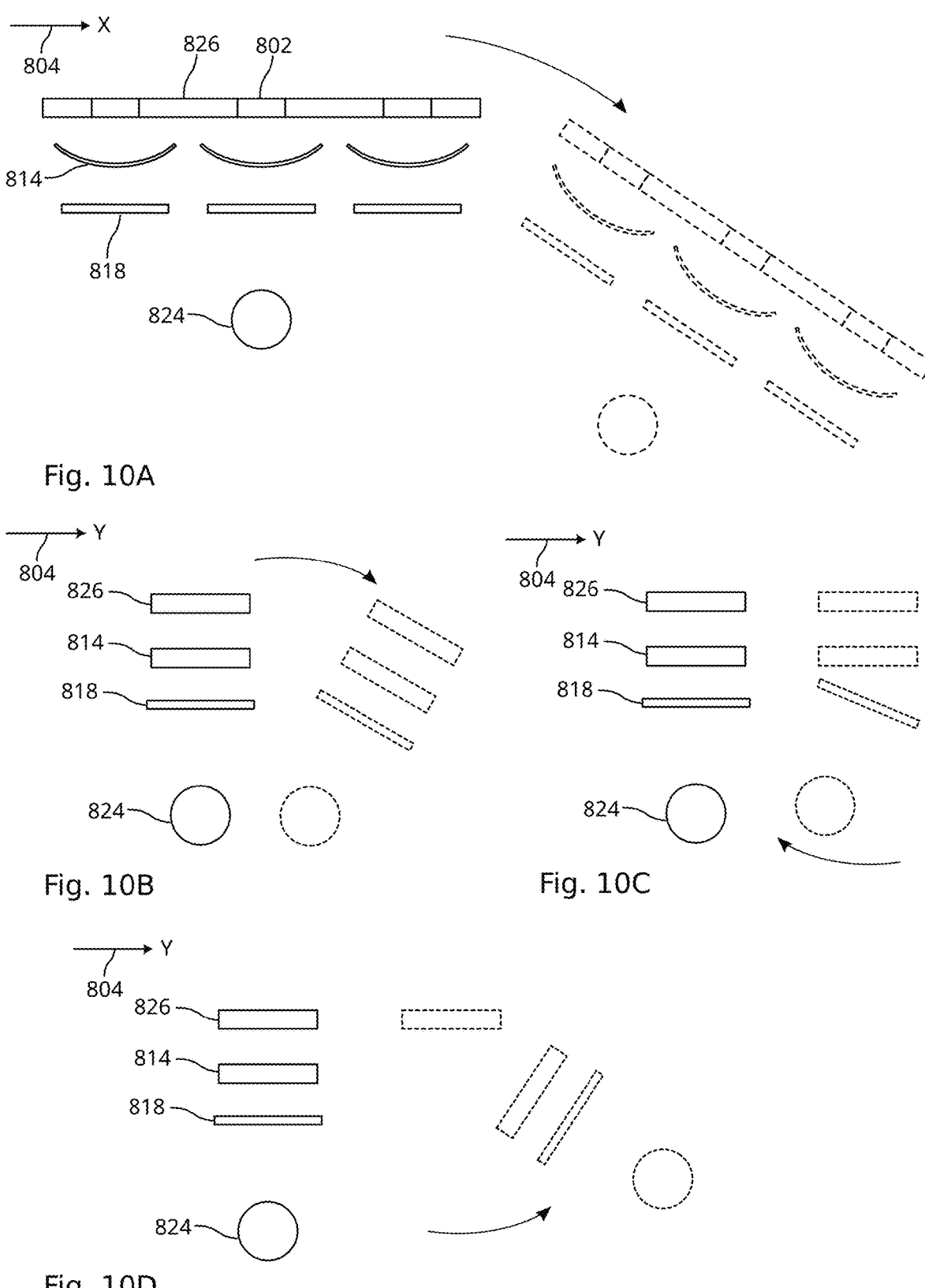
FIGS. 10A through 10D are partial cross-sectional views depicting the system of FIGS. 8A through 8C featuring first plane alignment options.

FIGS. 10A through 10D are partial cross-sectional views depicting the system of FIGS. 8A through 8D featuring first plane alignment options. In some aspects, elements (components) in the system are rotatable in at least one or two dimensions with respect to the initial first plane 804, in the X plane (FIG. 10A) and in the Y plane (FIG. 10B). The rotations can be aided by mounting the PV cells 802, dichroic splitters 814, optical units 818, and/or thermal collection tube 824 to a configuration mechanism such as a shaft, spindle, or rollers (not shown) operated either manually or automatically by a motor and controller to track movement in the position of the Sun. In another aspect shown in FIG. 10C, only the optical unit 818 is rotated to track the Sun and focus the light onto thermal collection tube 824. Software to move lens (optical unit) 818 to track the apparent motion of the sun is well known. The angles in lens 818 determine the focal length of lens and therefore the optimal second distance 830 from lens 818 to thermal collection tube 824. In FIG. 10D the configuration mechanism is able to remove the dichroic splitters 814, optical units 818, and thermal collection tube 824 from the light path such as might be desirable in a greenhouse system during selected portions of a day or season. Although not explicitly shown, the various components of the system (dichroic splitter, optical unit, and thermal collection tube) can be moved independent of other system components, or removed from the light path independent of the other components.

In an exemplary embodiment, the thermal collection tube (or HCE) 824 can have a vacuum outer sleeve with an inner carbon coated stainless steel tube to minimize heat loss. Fluid, such as mineral oil, water with ethylene glycol, molten salt, or other energy absorbing fluid, can flow through the thermal collection tube 824. The thermal collection tube 824 may be connected to a cistern or tank (not shown) for thermal energy storage.

By using the thermal collection tube 824 to absorb heat from sunlight passing through the dichroic splitter 814 and optical unit 818, the full spectrum of light is absorbed to produce electricity and heat; both forms of energy can be stored and dispatched when needed. Therefore, although there is no light reaching down below system 800, into a greenhouse for example, the energy from the light is fully used. Alternatively, the system 800 may be configured to cover only a portion of the greenhouse roof area. To optimize the use of solar energy, in an exemplary embodiment, the system 800 faces toward the equator.

Figure 11:
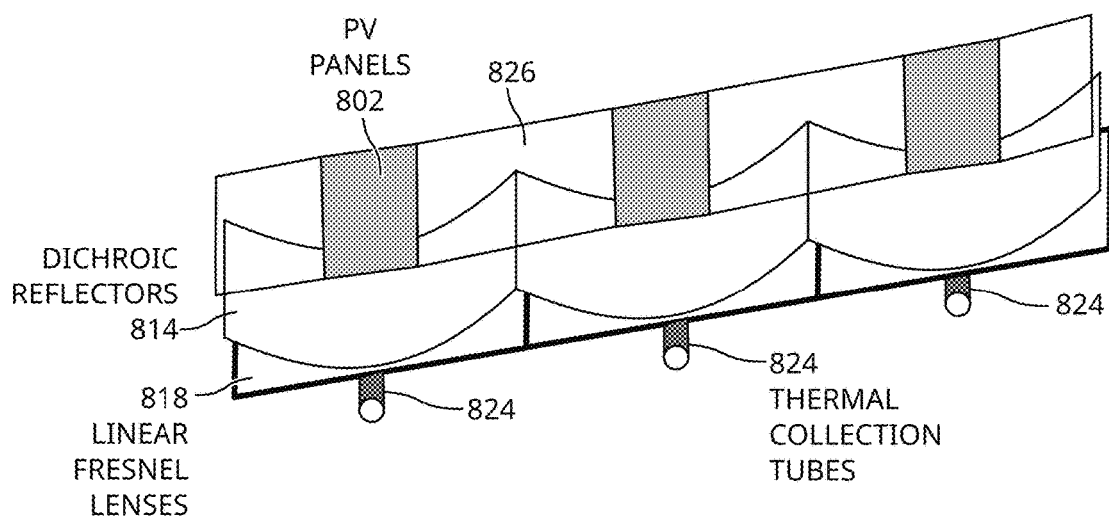
FIG. 11 is a perspective view depicting a variation of the system of FIGS. 8A through 8D utilizing multiple thermal collection tubes.

FIG. 11 is a perspective view depicting a variation of the system of FIGS. 8A through 8D utilizing multiple thermal collection tubes.

FIG. 12 is a partial cross-sectional view depicting an exemplary Fresnel lens.

Figure 13A:
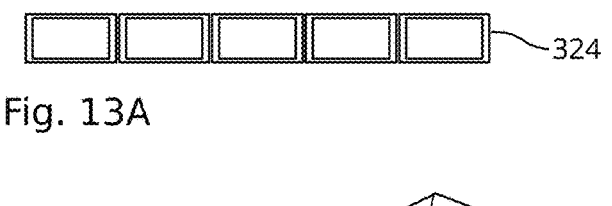
FIGS. 13A through 13E depict views of some exemplary optical funnel designs.
Figure 13B:
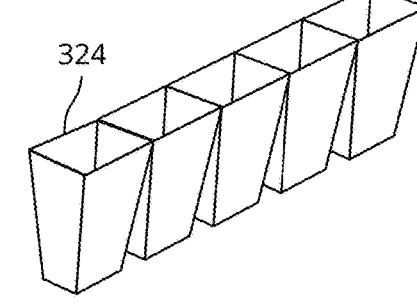
Figure 13C:
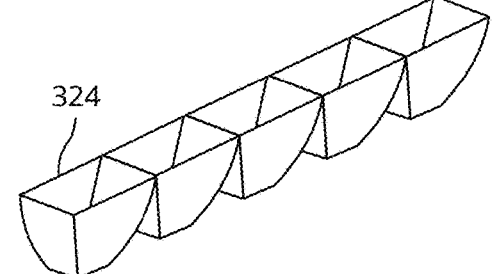
Figure 13D:
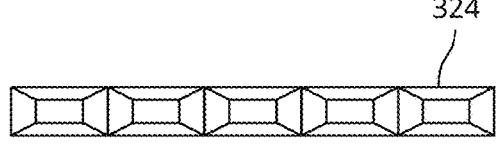
Figure 13E:
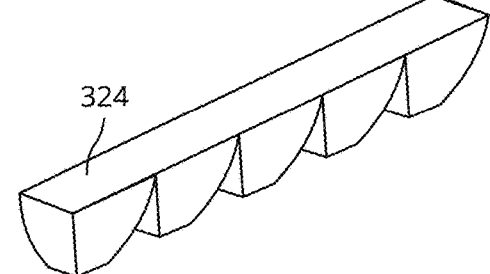

FIGS. 13A through 13E depict views of some exemplary optical funnel designs. FIGS. 13A and 13B illustrate a hollow optical funnel with inner reflective surfaces. As shown in these figures, the facets or outside surfaces may be flat, as shown in FIG. 13B, or curved as shown in FIG. 13C. For example, the optical funnel 324 may have curved exterior surfaces shaped as a compound parabolic concentrator (CPC). Alternatively, as shown in FIGS. 13D and 13E, the CPC may be a solid. In one aspect, the optical funnels may be a dielectric material with exterior surface facets that are either curved or flat, that transmit T band wavelengths of light accepted at an optical input aperture, initially by refraction, and subsequently to a corresponding receiving surface via total internal reflection (TIR).

The systems described above can be used in a greenhouse where both electricity and heat are needed to conduct agricultural activities. But the system is not limited to agricultural applications only. The systems can be used where "waste heat" is needed. One application is a membrane distillation for water treatment. In another variation the systems can be arranged on the roof and sides of a shipping container that can be deployed to a disaster area, and after opening, generate electricity and heat to disaster relief for communities. Inside the shipping container, battery and heat storage units, as well as a water desalination units, can be stowed. A plurality of shipping containers can become a command center with clean water, heat, and electricity. The systems may also be employed as part of a stationary water desalination center.

The energy production, electricity, and heat produced by such systems can be estimated according to each embodiment's geometric structure. The geometric ratio of PV area vs. open area, roughly about 1:4.5, may be used as a basis for the energy production calculation. More electricity production is anticipated, at the expense of less heat production, if the PV area is increased for the module area. Thus, one having ordinary skill in the art can readily configure the PV area ratio to obtain the best electricity to heat ratio for a particular application. However, heat and electricity are two different types of energy, and it is not easy to compare them directly. A term called exergy shall be used to convert the heat energy into a comparable unit with electricity energy. The exergy of heat equals the collected heat times the Carnot efficiency. At a temperature of 90° C., the Carnot efficiency is 17.9%. Thus, the collected heat energy shall be discounted by 82.1% before comparing to electricity energy, which is the highest grade in all energy forms. The discount rate is reduced when the collected heat temperature increases. At 400° C., the Carnot efficiency rises to 55.7%. At this temperature the heat has a greater capacity for work than it does at 90° C. For a steam engine, in which the heat temperature is at 575° C., the Carnot efficiency becomes 65%.

Taking the geometric ratio of PV area vs. module area as roughly about 1:4.5, the following table summarizes the electricity and heat exergy production per unit module area between two embodiments.

| Energy forms | PV Panel with reflector (FIG. 8B) | PV Panel without reflector (FIG. 3B) |
|---|---|---|
| Electricity, W/m^2 | 84.9 | 41.9 |
| Heat Ex, W/m^2 | 38.8 | 54.1 |
| Total Ex, W/m^2 | 123.7 | 96 |

In the exergy calculation, a reasonable linear Fresnel lens (LFL) optical efficiency and thermal collection tube efficiency are assumed.

Returning to the system of FIGS. 8A through 8D, this system describes a hybrid PV-heat module that adds another light concentration element after the TSM module of the FIG. 2 system. This light concentration element is typically a linear Fresnel lens. Since this Fresnel lens is directly underneath the dichroic splitters in the light path, it only concentrates the visible light onto a thermal collection tube in which a thermal fluid is flowing. Therefore, this Fresnel lens can be designed with higher (T band) optical efficiency than those designed for concentrating the full solar spectrum. Furthermore, the thermal fluid keeps cycling in the loop, receiving a bit of solar energy in each cycle. The fluid temperature can increase to a point that could never be reached without the Fresnel lens. In other words, by adding the Fresnel lens for light concentration, waster heat can be used as a heat source. While the visible wavelength heat transmitted by the system of FIG. 2 may be beneficial in some applications and/or some times of day or season, oftentimes it is not. The system of FIGS. 8A-8D takes the advantage of this potentially waste form of energy and converts it into a completely useful (storable) form of energy useful for any application, at any time of day or season.

Some other calculations are offered here as perspective. When solar irradiation enters the greenhouse without a hybrid PV-heat module, the interior temperature may rise to 50-60° C. At this temperature level, the heat is considered as waste heat—because it cannot be used to do work. If the disclosed hybrid PV-heat system is used, the fluid temperature can be higher than 200° C. Heat at this temperature can be stored and do work.

In this embodiment, it is noticeable there are three sections of PV-reflector-Fresnel to form a hybrid PV-heat module, for example, to cover a section of greenhouse roof area. The system is designed to allow users to freely choose one, two, or three sections, letting more, less, or no sunlight into the greenhouse for growing. In this way a grower can have full control of growth conditions. For example, a low light condition is desirable for mushroom growing.

The hybrid PV-heat module produces both electricity and heat, two forms of energy that are needed for membrane distillation water desalination, so these systems may adapted to new technologies under development, in which heat drives the entire desalination process. For this particular application the system of FIGS. 3A and 3B may be especially useful, where a parallel structure is used instead of a tandem structure. In a parallel structure the PV light path is "parallel" to the heat path. Using a parallel configuration, the light pass length is reduced since there is no reflector to occupy physical space and more sunlight that can be converted into heat to drive water treatment process.

While prior art is known using reflective Fresnel lens concentration for heat generation and a transmissive Fresnel lens for PV light collection, there is no prior art concerning the transmission of visible light wavelengths for heat collection. Furthermore, as we discussed above, a Fresnel lens to concentrate the full solar spectrum has lower optical efficiency as compared to a Fresnel lens concentration of only a partial (e.g., visible light) spectrum. To boost optical efficiency in the system of FIGS. 3A-3B, a light funnel is added that uses total internal reflection (TIR) to confine light inside the funnel before being absorbed by the thermal collection tube. As noted above, this system can be adapted in an array to form a hybrid PV-heat assembly that can be installed atop of a building, in the open field, or onto a shipping container surface.

Figure 14:
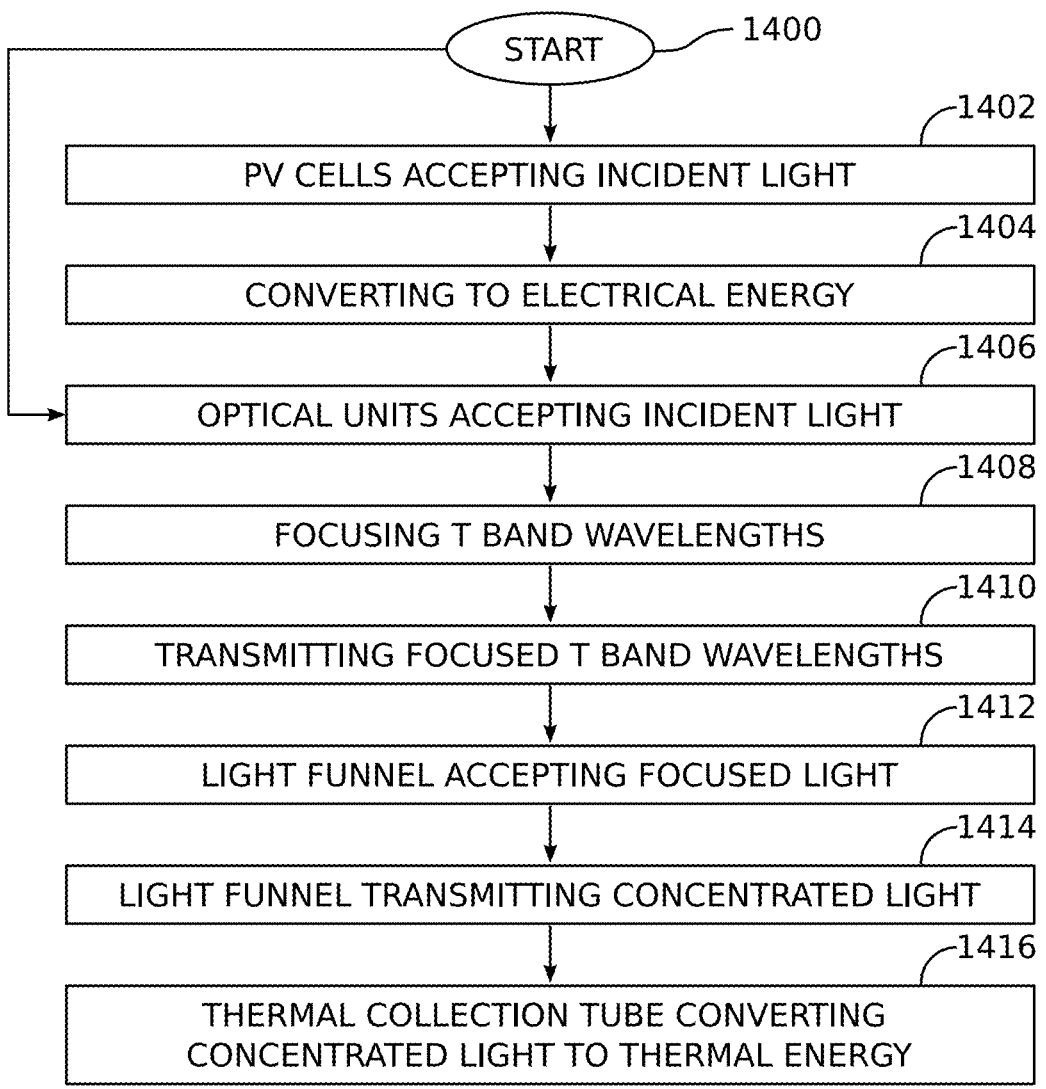
FIG. 14 is a flowchart illustrating a method for hybrid photovoltaic (PV) and thermal energy collection.

FIG. 14 is a flowchart illustrating a method for hybrid photovoltaic (PV) and thermal energy collection. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps and is associated with the system and subcomponents of the system described in the system depicted in FIGS. 3A-3B. The method starts at Step 1400.

Step 1402 provides a plurality of PV cells arranged in a first plane accepting incident light. In Step 1404 the PV cells convert the accepted light to electrical energy. Step 1406 provides a plurality of optical units, arranged in spacings adjacent to the PV cells, accepting incident light. In one aspect the spacings are located between PV cells. In Step 1408 the optical units focus T band wavelengths of the accepted incident light. In one aspect, the T band is the visible wavelengths of light, approximately 400 to 700 nm. Alternatively, the T band may be a full spectrum of light wavelengths (whatever light is incident). In Step 1410 the optical units transmit the focused T band light wavelengths. Step 1412 provides a light funnel accepting the focused T band light wavelengths. In Step 1414 the light funnel transmits concentrated T band wavelengths of light; and, Step 1416 provides a thermal collection tube converting the concentrated T band wavelengths of light to thermal energy.

Figure 15:
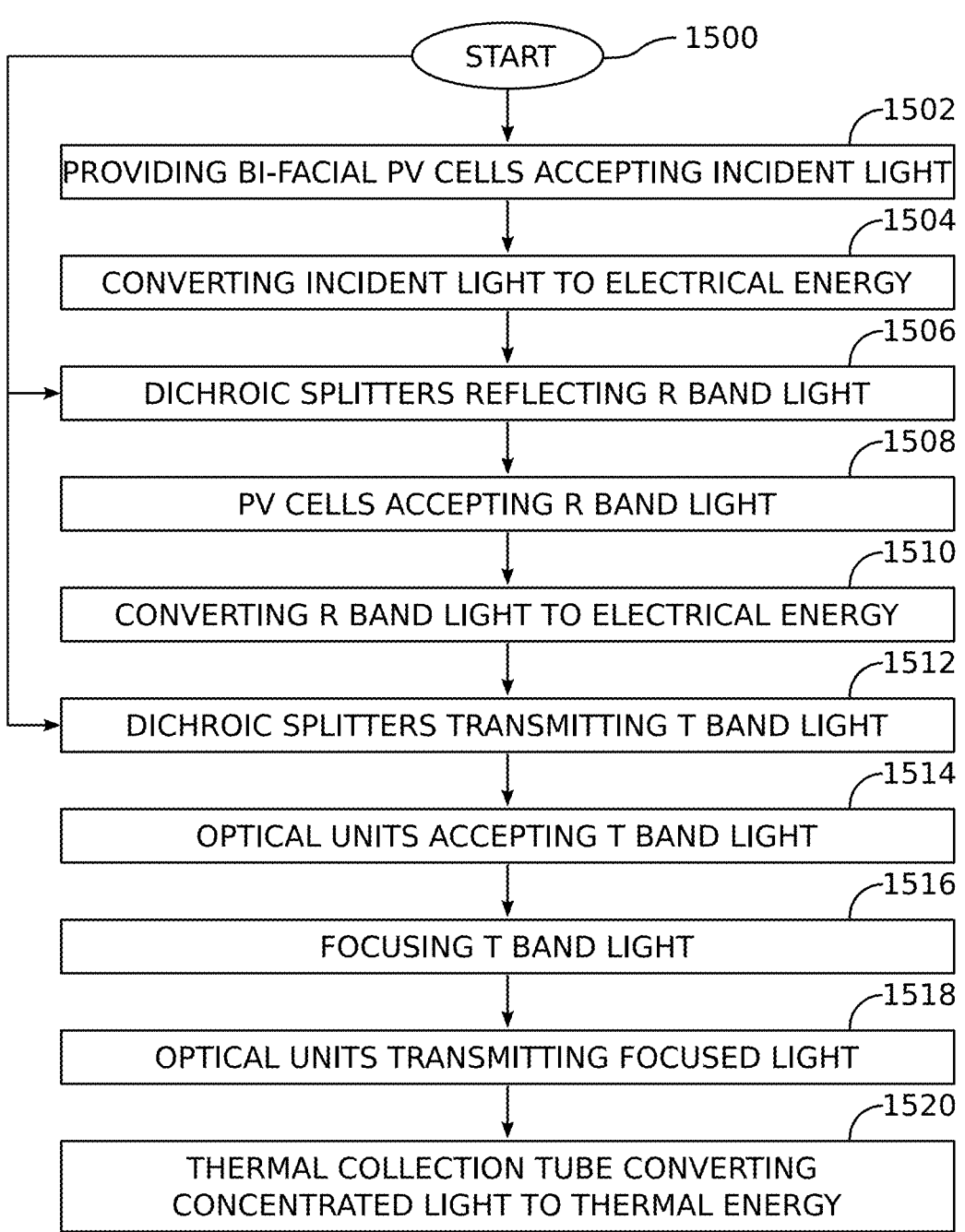
FIG. 15 is a flowchart illustrating a variation of the method for hybrid photovoltaic and thermal energy collection.

FIG. 15 is a flowchart illustrating a variation of the method for hybrid photovoltaic and thermal energy collection generally corresponding to the system depicted in FIGS. 8A-8D. The method begins at Step 1500. Step 1502 provides a plurality of bi-facial PV cells arranged in a first plane, with each PV cell having a first face accepting incident light. In Step 1504 the PV cells first face converts incident light to electrical energy. Step 1506 provides a plurality of arcuate dichroic splitters underlying transparent spaces in the first plane, with each dichroic splitter having a first face reflecting R band wavelengths of light. In one aspect, the R band may consist of one of NIR, IR, UV wavelengths, or combinations thereof. In Step 1508 the PV cells have a second face accepting reflected R band wavelength light. In Step 1510 the PV cells second face converts reflected R band wavelengths of light to electrical energy. In Step 1512 the dichroic splitters have a second face transmitting T band wavelengths of light. As mentioned above, the R and T bands are not limited to any particular wavelength ranges, but in one aspect the T band comprises visible spectrum light. Step 1514 provides a plurality of optical units underlying the dichroic splitters, with each optical unit having a first face accepting T band wavelengths of light from corresponding dichroic splitters. In Step 1516 the optical units focus the accepted T band wavelengths of light. In Step 1518 the optical units have a second face transmitting the focused T band light wavelengths. Step 1520 provides a thermal collection tube converting focused T band wavelengths to thermal energy.

Hybrid electrical/thermal solar conversion systems and methods have been provided. Examples of particular subcomponents and components layouts have been presented to illustrate the invention. However, the invention is not limited to merely these examples. Other variations and embodiments of the invention will occur to those skilled in the art.

I claim:

1. A hybrid photovoltaic (PV) and thermal energy collection system, the system comprising:
   a plurality of PV cells arranged in a first plane, each PV cell having a face to accept incident light;
   a plurality of optical units arranged adjacent to the PV cells in the first plane, each optical unit having a first face to accept incident light and a second face transmitting focused light to a thermal region underlying the first plane; and,
   a thermal collection tube formed in the thermal region.

2. The system of claim 1 further comprising:
   a light funnel to accept the focused light from the optical units and supply concentrated light to the thermal collection tube.

3. The system of claim 2 wherein each light funnel is a dielectric material transmitting concentrated wavelengths of light accepted at an optical input aperture, initially by refraction, and subsequently to the thermal collection tube via total internal reflection (TIR).

4. The system of claim 2 wherein the light funnel is a compound parabolic concentrator.

5. The system of claim 1 wherein the optical units are selected from the group consisting of linear Fresnel lenses, cylindrical lenses, and acylindrical lenses.

6. The system of claim 1 wherein elements in the system are rotatable with respect to the first plane.

7. The system of claim 1 wherein a plurality of thermal collection tubes is formed in the thermal region.

8. The system of claim 1 wherein to ratio of PV cell face surface area to optical unit first face surface area is in a range of 1:2 to 1:6.

9. The system of claim 1 wherein the optical units are formed in spacings between PV cells.

10. A hybrid photovoltaic (PV) and thermal energy collection system, the system comprising:
   a plurality of bi-facial PV cells arranged in a first plane, each PV cell having a first face to directly accept incident light and a second face to accept reflected light;
   a plurality of arcuate dichroic splitters underlying the first plane, each dichroic splitter having a first face to reflect R band wavelengths of light to the second face of corresponding PV cells, and a second face transmitting T band wavelengths of light;
   a plurality of optical units underlying the dichroic splitters, each optical unit having a first face to accept T band light from corresponding dichroic splitters, and a second face to transmit focused T band light; and,
   a thermal collection tube to accept focused T band light.

11. The system of claim 10 wherein the optical units are selected from the group consisting of linear Fresnel lenses, cylindrical lenses, and acylindrical lenses.

12. The system of claim 10 wherein the bi-facial PV cells are arranged in a grid pattern in a first plane, with spacings between the bi-facial PV cells; and, wherein the dichroic splitters are formed underlying the spacings in the first plane.

13. The system of claim 10 wherein elements of the system are rotatable with respect to the first plane.

14. The system of claim 10 further comprising a plurality of thermal collection tubes is formed in a thermal region.

15. The system of claim 10 wherein the optical units optimally focus T band wavelength light.

16. The system of claim 10 wherein to ratio of PV cell first face surface area to dichroic first face surface area is in a range of 1:2 to 1:6.

17. The system of 10 further comprising:

a configuration mechanism underlying the first plane, moveable with respect to the first plane; and, wherein the dichroic splitters, optical units, and thermal collection tube are connected to the configuration mechanism, so as to be removable from underlying the PV cells.

18. The system of claim 10 wherein the T band comprises visible wavelengths of light.

19. A method for hybrid photovoltaic (PV) and thermal energy collection, the method comprising:

providing a plurality of PV cells arranged in a first plane accepting incident light;

the PV cells converting the accepted light to electrical energy;

providing a plurality of optical units, arranged adjacent to the PV cells, accepting incident light;

the optical units focusing T band wavelengths of the accepted incident light;

the optical units transmitting the focused T band light wavelengths;

providing a light funnel accepting the focused T band light wavelengths;

the light funnel transmitting concentrated T band wavelengths of light; and, providing a thermal collection tube converting the concentrated T band wavelengths of light to thermal energy.

20. A method for hybrid photovoltaic (PV) and thermal energy collection, the method comprising:

providing a plurality of bi-facial PV cells arranged in a first plane, each PV cell having a first face accepting incident light;

the PV cells first face converting incident light to electrical energy;

providing a plurality of arcuate dichroic splitters underlying transparent spaces in the first plane, each dichroic splitter having a first face reflecting R band wavelengths of light;

the PV cells having a second face accepting reflected R band wavelength light;

the PV cells second face converting reflected R band wavelengths of light to electrical energy;

the dichroic splitters having a second face transmitting T band wavelengths of light;

providing a plurality of optical units underlying the dichroic splitters, each optical unit having a first face accepting T band wavelengths of light from corresponding dichroic splitters;

the optical units focusing the accepted T band wavelengths of light;

the optical units having a second face transmitting the focused T band light wavelengths; and, providing a thermal collection tube converting focused T band wavelengths to thermal energy.

*    *    *    *    *